United States Patent [19]

Yamada et al.

[11] 4,308,510
[45] Dec. 29, 1981

[54] SURFACE ACOUSTIC WAVE FILTER

[75] Inventors: Hiromichi Yamada, Nagaokakyo; Michio Kadota, Kyoto, both of Japan

[73] Assignee: Murata Manufacturing Co., Ltd., Japan

[21] Appl. No.: 160,579

[22] Filed: Jun. 18, 1980

[30] Foreign Application Priority Data

Jun. 25, 1979 [JP] Japan .................................. 54-80552

[51] Int. Cl.³ .......................... H03H 9/64; H03H 9/25
[52] U.S. Cl. .................................. 333/194; 333/195; 333/196
[58] Field of Search .............................. 333/193–196, 333/150–155; 310/313 R, 313 A, 313 B, 313 C, 313 D; 358/188, 905; 331/107 A

[56] References Cited

U.S. PATENT DOCUMENTS 4,223,284  9/1980  Inoue et al. .......................... 333/196

*Primary Examiner*—Marvin L. Nussbaum
*Attorney, Agent, or Firm*—Ostrolenk, Faber, Gerb & Soffen

[57] ABSTRACT

A surface acoustic wave filter comprises an interdigital transducer structured to excite individually a symmetrical component and an asymmetrical component for the purpose of achieving an asymmetrical frequency characteristic. The interdiginal transducer is divided into a plurality of portion electrodes in the propagating direction of the surface acoustic wave and the divided portion electrodes are electrically connected in series. Accordingly, the electrode fingers adjacent to each other at the dividing region have different potentials. One of the electrode fingers adjacent to each other at the dividing region is configured to be bent or widened toward the other electrode finger, while the other electrode finger is configured to be bent on widened toward the one electrode finger at the extended portion thereof.

18 Claims, 5 Drawing Figures

SURFACE ACOUSTIC WAVE FILTER

BACKGROUND OF THE INVENTION

1. Field of the Invention

The present invention relates to a surface acoustic wave filter. More specifically, the present invention relates to a surface acoustic wave filter adapted to achieve an asymmetrical frequency characteristic with respect to a given central frequency, wherein the interdigital electrode is divided into a plurality of portion electrodes in the propagating direction of the acoustic surface wave and the divided portion electrodes are electrically connected in series.

2. Description of the Prior Art

Recently a surface acoustic wave device has been used as a video intermediate frequency filter in a television receiver, for example. As well known, a video intermediate frequency filter in a television receiver requires a sound trap characteristic as well and hence must have an asymmetrical frequency response characteristic with respect to the central frequency (such as the frequency f intermediate a picture signal frequency and a chrominance signal frequency). Conventionally, a surface acoustic wave filter having an asymmetrical frequency response characteristic with respect to such central frequency has been implemented using the reflection method or a method similar thereto, or a variable pitch method. The present invention is directed to an improvement in a surface acoustic wave filter for achieving the above described asymmetrical frequency response characteristic based on the reflection method or a method similar thereto.

The reflection method and an interdigital electrode structure obtained by such method are described in U.S. Pat. No. 3,968,461, issued July 6, 1976 to Mitchell et al. and entitled "ACOUSTIC SURFACE-WAVE DEVICES". Therefore, such an electrode structure attained by the reflection method will be briefly described to the extent necessary in describing the present invention. According to the reflection method, an electrode pattern is determined based on an impulse response obtained by Fourier transformation or Fourier series expansion of an asymmetrical frequency characteristic. Such impulse response comprises a symmterical component (a cosine component) and an asymmetrical component (a sine component). Exciting sources for exciting the symmetrical component and asymmetrical component are separately provided in such a manner that these are alternately disposed in the transducer in the propagating direction of the surface acoustic wave. One example of a structure of an interdigital electrode thus formed in accordance with the reflection method is shown in FIG. 1.

In the conventional example shown in FIG. 1, electrode fingers 1a, 1b, ... 5a, 5b and 1c, ... 5c constituting an interdigital transducer are selected to have a width of $\frac{1}{8}\lambda$, where $\lambda$ is the wave length of the surface acoustic wave for the central frequency, as shown in FIG. 1. The arrangement pitch of these electrode fingers 1a, 1b, ... 5a, 5b and 1c, ... 5c is selected to be $\frac{1}{4}\lambda$. The width and the pitch of these electrode fingers are each a half of the ordinary width and pitch. In the case of the FIG. 1 example, the electrode fingers 1a and 1b; 2a and 2b; ... are each formed as a pair. Then each of the electrode finger pairs is alternately connected to the corresponding one of common portions 10 and 11 which are placed at different potentials. Such electrode structure is rather similar to a surface acoustic wave filter of the so-called split electrode type. Such surface acoustic wave device of the so called split electrode type is disclosed in, for example, U.S. Pat. No. 3,727,155, issued Apr. 10, 1973 to Adrian J. DeVries and entitled "Acoustic Surface Wave Filter". Still referring to the FIG. 1 example, one electrode finger 1a, 2a, ... of each of paired main electrode fingers 1a and 1b; 2a and 2b; ... has, on an extention of the free end thereof, an auxiliary electrode finger 1c, 2c, ... connected to common portions 11 and 12 different from those of these paired main electrode fingers 1a and 1b, 2a and 2b, ... The symmetrical component is excited at each of the regions (hatched in the left downward direction in FIG. 1) between the adjacent main electrode fingers 1b and 2a; 2b and 3a; ... of different potentials. Furthermore, the asymmetrical component is excited at each of the regions (hatched in the right downward direction in FIG. 1) between the adjacent auxiliary electrode fingers and the main electrode fingers 1c and 1b; 2c and 2b; ... Thus the symmetrical component and the asymmetrical component can be separately excited in a single transducer. As a result, the asymmetrical frequency characteristic necessary for a video intermediate frequency filter can be attained.

On the other hand, the electrostatic capacitance of the interdigital transducer becomes a total sum of electrostatic capacitances formed between the respective adjacent electrode fingers. Accordingly, when a piezoelectric material of high dielectric constant is used, the electrostatic capacitance of the transducer becomes large. Accordingly, in incorporating a surface acoustic wave filter in an electrical circuit, it would become difficult to attain proper impedance matching. Therefore, particularly in the case where a relatively large number of electrode fingers is formed, it has been conventional, for the purpose of reducing the electrostatic capacitance, to divide an interdigital electrode forming the transducer into a plurality of portion electrodes in the propagating direction of the surface acoustic wave and to connect the divided portion electrodes electrically in series. Such divided type transducer is disclosed in U.S. Pat. No. 3,600,710, issued Aug. 18, 1971 to Robert Adler and entitled "ACOUSTIC SURFACE WAVE FILTER", for example. However, in the case where an interdigital electrode formed in accordance with the reflection method as depicted in conjunction with FIG. 1 is divided into a plurality of portion electrodes in accordance with U.S. Pat. No. 3,600,710, another problem arises.

More specifically, in the case where such an electrode configuration as shown in FIG. 1 is to be divided, the excitation intensity of the surface acoustic wave at the dividing region becomes larger than the original excitation intensity in the case of non-division, and consequently the resultant frequency characteristic is degraded.

FIG. 2 is an electrode pattern of this type, with reference to which the problem will be discussed. Referring to FIG. 2, the divided portion electrodes are denoted by the reference characters E1 and E2. Meanwhile, the FIG. 2 electrode pattern shows an example wherein the interdigital electrode is divided at the position of the arrow A in FIG. 1. It has been a common practice that such division is made in a region where a relatively large component (in the case of FIG. 1 the symmetrical component) is to be excited. The region between the portion electrodes E1 and E2 in FIG. 2 corresponds to the region shown by the arrow A in FIG. 1. The main electrode finger 3b included in the portion electrode E1 is adjacent to the main electrode finger 4a' included in the portion electrode E2, with the dividing region D therebetween. As seen from FIG. 2, a voltage as high as two times the voltage between the original main electorode fingers (i.e. not divided, as shown in FIG. 1) is applied between the main electrode fingers 3b and 4a'. In accord therewith, due to the relation with other electrode fingers outside the dividing region, the overlapping length of the main electrode fingers 3b and 4a' has been selected to be more or less greater than that of FIG. 1. Therefore, it will be appreciated that in the FIG. 2 example the excitation intensity at the dividing region has become as large as approximately three times that of FIG. 1. (In FIGS. 1, 2 and 3, each arrow symbol denotes a unit amount of the excitation intensity.) Since the excitation intensity at the dividing region thus becomes larger than that of the original one, the frequency characteristic of a surface acoustic wave filter including such transducer becomes more degraded than that desired. Accordingly, one might think of selecting the overlapping length of the adjacent main electrode fingers 3b and 4a' to be less than that of the original one shown in FIG. 1. However, since the excitation intensity of the exciting source positioned at both sides of the dividing region has been made consistent with the corresponding one of the FIG. 1 conventional one, a mere change of the lengths of the adjacent electrode fingers at the dividing region causes a change in the exciting intensity of the exciting sources positioned at both sides thereof. Accordingly, a mere change of the lengths of the adjacent electrode fingers at the dividing region can not achieve adjustment of the excitation intensity to be adaptable to the original one.

SUMMARY OF THE INVENTION

In brief, the present invention comprises a surface acoustic wave filter adapted for separately exciting a symmetrical component and an asymmetrical component in a transducer for the purpose of achieving an asymmetrical frequency characteristic, wherein the interdigital electrode is divided into a plurality of portion electrodes in the propagating direction of the surface acoustic wave and the divided portion electrodes are electrically connected in series. At least one out of the two adjacent electrode fingers at the dividing region is formed with a deformed portion protruding toward the other one at an extended portion thereof.

According to the present invention, there is provided a surface acoustic wave filter including an interdigital electrode formed based on the reflection method or a method similar thereto, wherein the interdigital electrode is divided into a plurality of portion electrodes and the divided portion electrodes are electrically connected in series, and wherein a desired frequency characteristic can be attained with ease. More specifically, in accordance with a conventional approach for such division, a mere change of the length of the adjacent electrode fingers at the dividing region was not able to achieve adjustment of the excitation intensity at the dividing region so as to be consistent with a desired frequency characteristic, which made it impossible to make such division without degrading the frequency characteristic. However, according to the present invention, such division of the interdigital electrode can be made with extreme ease, without degrading the frequency characteristic. Accordingly, even in achieving an asymmetrical frequency characteristic, the electrostatic capacitance can be reduced, without degrading the frequency characteristic.

Accordingly, a principal object of the present invention is to provide a surface acoustic wave device having an improved interdigital electrode structure.

Another object of the present invention is to provide a surface acoustic wave filter achieving an asymmetrical frequency characteristic, wherein the electrostatic capacitance of the transducer can be reduced, thereby to facilitate impedance matching with a circuit using the filter.

A further object of the present invention is to provide a surface acoustic wave filter, wherein the interdigital electrode can be divided into a plurality of portion electrodes, without degrading the frequency characteristic.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
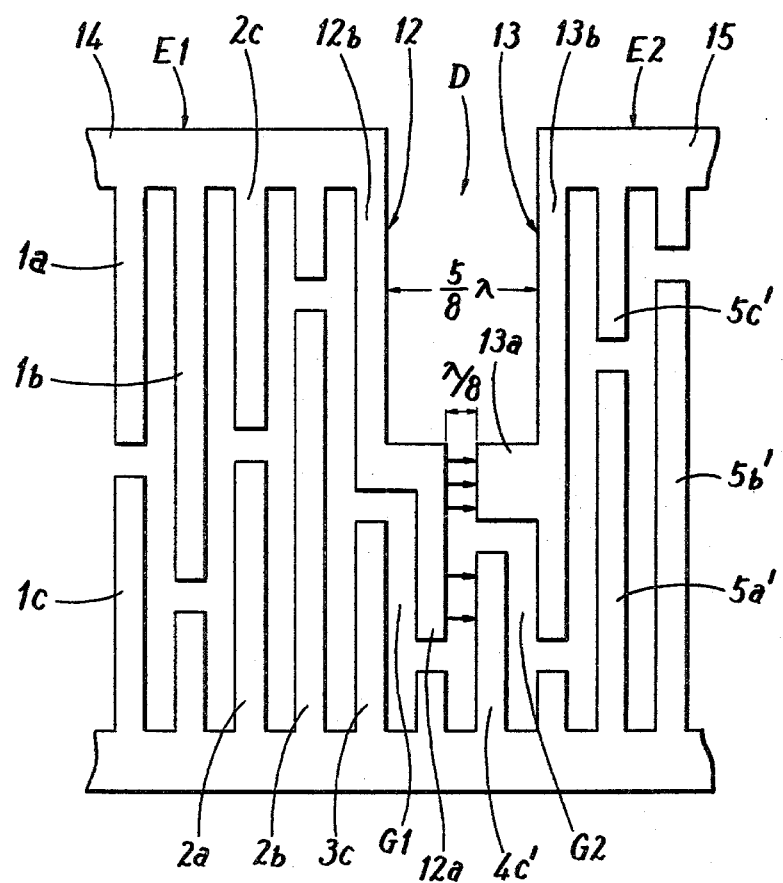
FIG. 3 is a view showing an electrode pattern of one embodiment of the present invention.

FIG. 3 is a view showing an electrode pattern according to one embodiment of the present invention. FIG. 3 particularly shows in an enlarged manner only a portion in the vicinity of the dividing region of the electrode pattern wherein the individual interdigital electrode of the FIG. 1 conventional surface acoustic wave filter is divided in accordance with the present invention. Referring to FIG. 3, the interdigital electrode is divided into portion electrodes E1 and E2 and the portion electrodes E1 and E2 are electrically connected in series. These portion electrode E1 and E2 are formed on a well known piezoelectric substrate, although such is not clearly shown in the figure. More specifically, the interdigital transducer comprises a piezoelectric substrate and an interdigital electrode formed on the substrate. The dividing region D is shown between the portion electrodes E1 and E2. As compared with the conventional one shown in FIG. 1, the portion electrodes E1 and E2 are structured such that the portion electrode E1 may be the same phase and the portion electrode E2 in the opposite phase. Referring to FIG. 3, the electrode fingers located to the left of the electrode finger 2b included in the portion electrode E1 is the same as that in FIG. 1 and has been denoted by the same reference character. Conversely, the electrode fingers to the right of the electrode finger 5a' included in the portion electrode E2 are disposed upside down, as viewed, as compared with FIG. 1, while the length is the same. Accordingly, the excitation intensity between these electrode fingers is the same as that of FIG. 1. Portions of portion electrode E2 in FIG. 3 have been denoted by the same reference characters as used in FIG. 1, with a prime added. The FIG. 3 embodiment has been adapted such that by reversing the arrangement of the respective electrode fingers included in the portion electrode E2 with respect to that of FIG. 1, the direction or polarity of the voltage applied between the respective electrode fingers may be the same as the direction or polarity of the voltage being applied to the corresponding portion shown in FIG. 1. Furthermore, an auxiliary electrode finger 3c is formed in the same manner as in FIG. 1, while an auxiliary electrode finger 4c' is formed in an upside down arrangement as compared with that of FIG. 1.

It is pointed out that the concept of the present invention has been applied to the adjacent electrode fingers 12 and 13 at the dividing region D. More specifically, the electrode fingers 12 and 13 are formed with deformed portions 12a and 13a, respectively. The deformed portion 12a of the electrode finger 12 comprises a bent portion, whereas the deformed portion 13a of the electrode finger 13 comprises a widened portion. Either of the electrode fingers 12 and 13 corresponds to two of the other, ordinary electrode fingers. The electrode finger 12 comprises electrode portions 12a and 12b corresponding to the electrode fingers 3a and 3b in FIG. 1, respectively, and the electrode finger 13 comprises electrode portions 13a and 13b corresponding to the electrode fingers 4a and 4b in FIG. 1, respectively. The bent electrode portion 12a of the electrode finger 12 and the widened electrode portion 13a of the electrode finger 13 are formed to be adjacent to each other. The distance between these electrode portions 12a and 13a is selected to be approximately $\frac{1}{8}\lambda$. The electrode portion 12b for connecting the electrode portion 12a to the common portion 14 and the electrode portion 13b for connecting the electrode portion 13a to the common portion 15 are formed spaced apart from each other by $\frac{3}{8}\lambda$. Accordingly, the protruding length of the electrode portion 12a from the electrode portion 12b is $(2/8)\lambda$ and the protruding length of the electrode portion 13a from the electrode portion 13b is also $(2/8)\lambda$. Meanwhile, the respective lengths of these electrode fingers 12 and 13 have been selected to be the same as those of the individual electrode fingers 3b and 4b in FIG. 1. The purpose is to make the exciting sources G1 and G2 formed at both sides of the dividing region D the same as the corresponding ones in FIG. 1.

Figure 1:
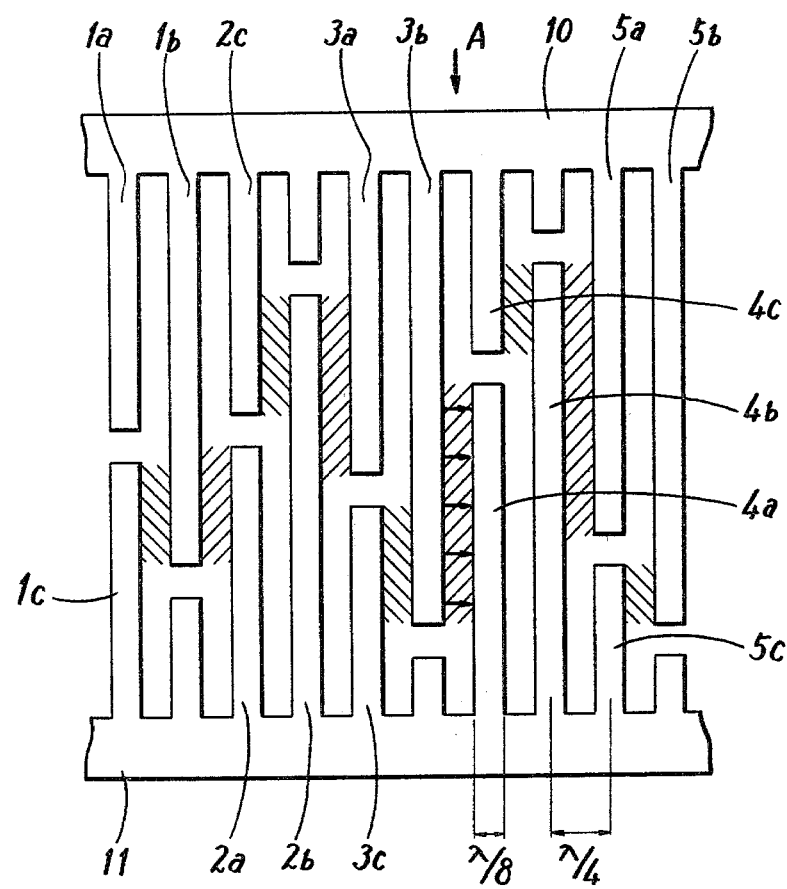
FIG. 1 is a view showing one example of an electrode pattern of a conventional surface acoustic wave filter.

An exciting source of the symmetrical component is formed between the electrode portion 12a of the electrode finger 12 and the electrode portion 13a of the electrode finger 13. The magnitude of such exciting source is selected to supplement excitation of the symmetrical component, which is deficient, having only the excitation source which is formed between the electrode portion 12a and the auxiliary electrode finger 4c'. Accordingly, the exciting source formed between the electrode fingers 3b and 4a in FIG. 1 is equal to the sum of the exciting source formed between the electrode portions 12a and 13a and the exciting source formed between the electrode portion 12a and the auxiliary electrode finger 4c'. Meanwhile, the excitation intensity of the surface acoustic wave between the respective connecting electrode portions 12b and 13b of the electrode fingers 12 and 13 is extremely small, in as much as the width of the dividing region D is as large as $\frac{3}{8}\lambda$. Accordingly, the surface acoustic wave being excited between the electrode portions 12b and 13b is normally negligible but, in consideration of the above described exciting source, the overlapping length of the electrode portions 12a and 13a may be shortened by the amount of excitation occurring between electrode portions 12b and 13b. As seen from the FIG. 3 embodiment, by forming the deformed portions in the adjacent electrode fingers 12 and 13 at the dividing portion D, the interdigital electrode can be divided while maintaining the strength of the exciting source the same as that of FIG. 1, i.e. without degrading the frequency characteristic.

Figure 2:
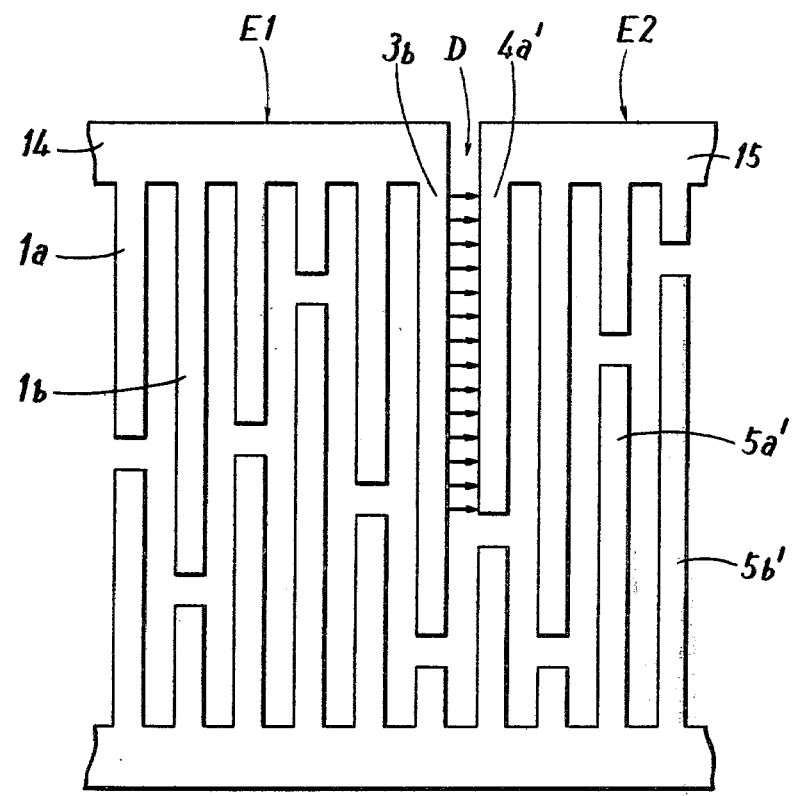
FIG. 2 is a view depicting an example of a divided type electrode structure wherein the interdigital electrode of the FIG. 1 surface acoustic wave filter is divided into a plurality of portion electrodes.
Figure 4:
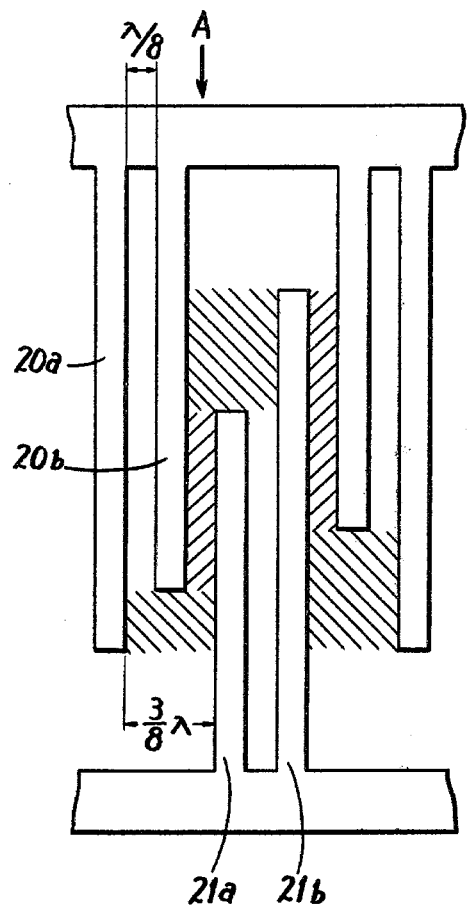
FIG. 4 is a view showing another example of an electrode pattern of a conventional surface acoustic wave filter.
Figure 5:
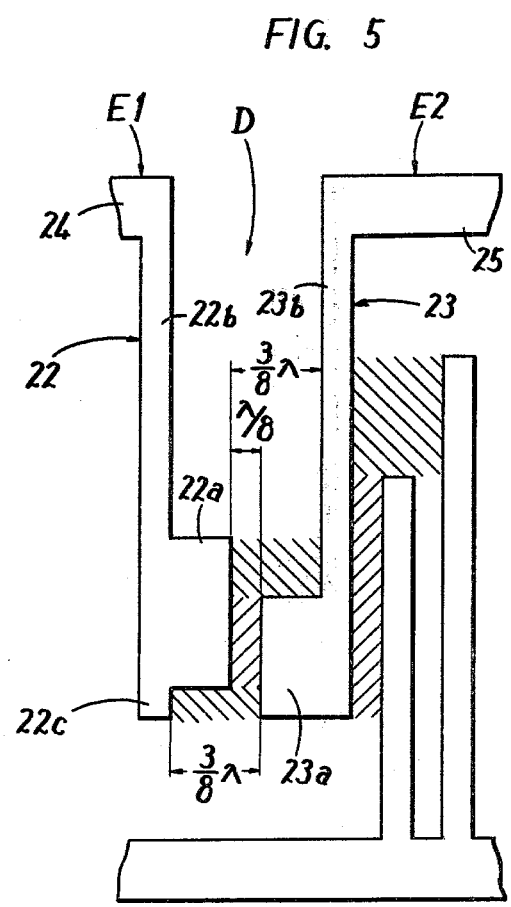
FIG. 5 is a view showing an electrode pattern of another embodiment of the present invention and particularly showing an example wherein the present invention is employed in the FIG. 4 surface acoustic wave filter.

FIG. 5 is a view showing an electrode pattern of another embodiment of the present invention. The embodiment shown is a case where the present invention is practiced in connection with the FIG. 4 example of the prior art. More specifically, the FIG. 5 embodiment comprises a surface acoustic wave filter having an interdigital electrode, wherein the interdigital electrode is divided into a plurality of portion electrodes for the purpose of reducing the electrostatic capacitance. The FIG. 4 example is somewhat different from those shown in FIGS. 1, 2 and 3 and is not provided with the auxiliary electrode fingers. The asymmetrical component is excited in the regions hatched in the right downward direction in FIG. 4, i.e. in the region between the main electrode fingers 20a and 21a as spaced apart from each other by $\frac{3}{8}\lambda$. The symmetrical component is excited in the regions hatched in the left downward direction in FIG. 4, i.e. in the region between the main electrode fingers 20b and 21a.

The FIG. 5 embodiment is a case of the electrode pattern wherein the electrode pattern shown in FIG. 4 is divided in accordance with the present invention. The dividing region D is formed also in the FIG. 5 embodiment between the divided portions E1 and E2. At the dividing region D the electrode finger 22 included in the portion electrode E1 and the electrode finger 23 included in the portion electrode E2 are adjacent to each other. These electrode fingers 22 and 23 have different potentials, as in the case of the previously described FIG. 3 embodiment. The electrode finger 22 comprises a deformed portion or electrode portion 22a protruding toward the electrode finger 23 and a connecting electrode portion 22b for connecting the electrode portion 22a to the common portion 24. Similarly, the electrode finger 23 also comprises a deformed portion or electrode portion 23a protruding toward the electrode finger 22 and a connecting electrode portion 23b for connecting the electrode portion 23a to the common portion 25. The electrode portions 22a and 23a are disposed to be spaced apart from each other with the spacing of $\frac{1}{8}\lambda$ therebetween, as in the case of the previously described embodiment. The symmetrical component is excited at the overlapping portion or the facing portion. An electrode portion 22c is further extended from the electrode potion 22a of the electrode finger 22 and is spaced laterally apart from the electrode portion 23a with the spacing of $\frac{3}{8}\lambda$. Accordingly, the asymmetrical component is excited between the electrode portion 22c and the electrode portion 23a. A portion of the electrode portion 22a and a portion of the electrode portion 23b face each other with the spacing $\frac{3}{8}\lambda$, and accordingly the asymmetrical component is also excited at the opposing portion. Since a voltage as high as two times the normal voltage at the other portion is applied between the electrode fingers 22 and 23, the length of the portion contributing to excitation has been shortened, as compared with the case of FIG. 4. According to the FIG. 5 embodiment, the interdigital electrode having a conventional electrode as shown in FIG. 4 can be effectively divided, for the purpose of reducing the electrostatic capacitance, with the excitation intensity at the dividing region maintained the same as that before division, and without degrading the frequency characteristic.

In the foregoing description, the embodiments have been described without depicting the whole configuration of a surface acoustic wave filter including the interdigital electrode. However, the whole configuration of such filter has been fully depicted in the previously referred to U.S. Pat. Nos. 3,968,461 and 3,600,710. Accordingly, in the foregoing description only two adjacent electrode fingers at the dividing region of particular interest to the present invention have been fully described. It is also pointed out that the present invention can be applied to any surface acoustic wave filter wherein an electrode pattern is prepared based on the reflection method or a method similar thereto and the symmetrical component and the asymmetrical component in the asymmetrical frequency characteristic are separately excited in the same interdigital transducer. The number of divisions for reducing the electrostatic capacitance may be arbitrarily selected in consideration of the circuit configuration where the inventive filter is employed.

Although in the previously described embodiments of FIGS. 3 and 5 deformed portions are formed at both of the two adjacent electrode fingers at the dividing region D, it is further pointed out that the present invention can be practiced by forming a deformed portion at only one of the two adjacent electrode fingers, without departing from the spirit of the present invention. Even in the case where a deformed portion is provided only in one electrode finger, the present invention can be suitably practiced by those skilled in the art in accordance with the principle of the invention described in conjunction with the above described embodiments in consideration of any other design factors and the required frequency characteristic.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave filter, comprising:
   a piezoelectric substrate;
   an interdigital electrode having a plurality of electrode fingers formed on said substrate, said electrode fingers being interdigited and defining a plurality of pairs of adjacent electrode fingers which cooperate to generate a surface acoustic wave which propagates in a predetermined direction along said substrate when a predetermined set of potentials is applied to said electrode, said surface acoustic wave having a central frequency f and having both a symmetrical and an asymmetrical component;
   said interdigital electrode being divided into first and second portion electrodes disposed in a row extending in said direction, said portion electrodes being electrically connected in series, a first electrode finger defining part of said first portion electrode and a second electrode finger defining part of said second electrode finger being adjacent to each other and at different potentials;
   said first electrode finger having a deformed portion extending towards said second electrode finger such that a first portion of said first electrode finger is a first distance from said second electrode finger as measured along said predetermined direction and a second portion, which forms part of said deformed portion, of said electrode finger is a second distance, less than said first distance, from said second electrode finger as measured along said predetermined direction.

2. A surface acoustic wave filter in accordance with claim 1, wherein said portion electrodes are separated by a gap extending in said predetermined direction and wherein said first and second electrode fingers are located at said gap.

3. A surface acoustic wave filter in accordance with claim 2, wherein said first and second portions of said first electrode finger each extend in a direction perpendicular to said predetermined direction, said second portion of said first electrode finger being coupled to said first portion of said first electrode finger by a third portion which extends in a direction parallel to said predetermined direction.

4. A surface acoustic wave filter in accordance with claim 3, wherein said second portion of said first electrode finger is spaced from said second electrode finger by $\lambda/8$ as measured in said predetermined direction, $\lambda = 1/f$, said symmetrical component of said surface acoustic wave being excited between said second portion of said first electrode finger and said second electrode finger.

5. A surface acoustic wave filter in accordance with claim 4, wherein said first portion of said first electrode finger is spaced from said second electrode finger by a distance which is sufficiently great to ensure that said asymmetrical component of said surface acoustic wave is excited between said first portion of said first electrode finger and said second electrode finger.

6. A surface acoustic wave filter in accordance with claim 2, wherein said deformed portion of said first electrode finger comprises a widened portion, said widened portion being widened in a direction parallel to said predetermined direction and toward said second electrode finger.

7. A surface acoustic wave filter in accordance with claim 6, wherein said deformed portion of said first electrode finger is spaced from said second electrode finger by $\lambda/8$ as measured along said predetermined direction, $\lambda = 1/f$, said symmetrical component of said surface acoustic means being excited between said deformed portion of said first electrode finger and said second electrode finger.

8. A surface acoustic wave filter in accordance with claim 7, wherein said first portion of said first electrode finger is spaced from said second electrode finger by a distance which is sufficiently great to ensure that said asymmetrical component of said surface acoustic wave is excited between said first portion of said first electrode finger and said second electrode finger.

9. A surface acoustic wave filter in accordance with any one of claims 6, 7 or 8, wherein said widened portion has a width of $3\lambda/8$ as measured along said predetermined direction and said first portion has a width of λ/8 as measured along said predetermined direction.

10. A surface acoustic wave filter in accordance with claim 1, wherein said second electrode finger has a deformed portion extending towards said first electrode finger such that said second distance is measured between said deformed portions of said first and second electrode fingers and said first distance is measured between non-deformed portions of said first and second electrode fingers.

11. A surface acoustic wave filter in accordance with claim 10, wherein said portion electrodes are separated by a gap extending in said predetermined direction and wherein said first and second electrode fingers are located at said gap, and wherein said second portions of said first and second electrode fingers each comprise a protruding portion of the respective said electrode fingers, said protruding portions extending toward each other through said gap.

12. A surface acoustic wave filter in accordance with claim 11, wherein said protruding portions of said first and second electrode fingers are spaced apart by λ/8 as measured along said predetermined direction, where λ=1/f.

13. A surface acoustic wave filter in accordance with claim 12, wherein said symmetrical component of said surface acoustic wave is generated between said deformed portions of said first and second electrode fingers.

14. A surface acoustic wave filter in accordance with claim 11, wherein said non-deformed portions of said first and second electrode fingers are spaced from each other by a distance which is sufficiently great to ensure that said asymmetrical component of said surface acoustic wave is excited between said first portion of said first electrode finger and said second electrode finger.

15. A surface acoustic wave filter in accordance with claim 14, wherein said non-deformed portions of said first and second fingers are spaced apart by 5λ/8 as measured along said predetermined direction.

16. A surface acoustic wave filter in accordance with claim 10, wherein the respective said non-deformed portions of said first and second electrode fingers extend parallel to each other and wherein said deformed portion of said first electrode finger includes a bent portion which is bent in a direction orthogonal to said first portion and toward said second electrode finger and an additional portion extending from said bent portion parallel to and away from said first portion of said first electrode finger.

17. A surface acoustic wave filter in accordance with claim 16, wherein said deformed portion of said second electrode finger comprises a widened portion, said widened portion being widened in a direction orthogonal to said non-deformed portion of said second electrode and toward said first electrode finger.

18. A surface acoustic wave filter in accordance with claim 17, wherein said deformed portion of said second electrode finger has a width of 3λ/8 as measured along said predetermined direction and said non-deformed portion of said first and second electrode fingers has a width of λ/8 as measured along said predetermined direction, where λ=1/f.

* * * * *